(12) United States Patent
Dadheech et al.

(10) Patent No.: US 10,829,665 B2
(45) Date of Patent: Nov. 10, 2020

(54) METHOD OF FORMING A SELF-CLEANING FILM SYSTEM

(71) Applicant: GM Global Technology Operations LLC, Detroit, MI (US)

(72) Inventors: Gayatri V. Dadheech, Bloomfield Hills, MI (US); Thomas A. Seder, Fraser, MI (US); James A. Carpenter, Rochester Hills, MI (US)

(73) Assignee: GM GLOBAL TECHNOLOGY OPERATIONS LLC, Detroit, MI (US)

( * ) Notice: Subject to any disclaimer, the term of this patent is extended or adjusted under 35 U.S.C. 154(b) by 195 days.

(21) Appl. No.: 16/033,924

(22) Filed: Jul. 12, 2018

(65) Prior Publication Data

US 2018/0320023 A1    Nov. 8, 2018

Related U.S. Application Data

(62) Division of application No. 15/429,577, filed on Feb. 10, 2017, now Pat. No. 10,052,622.

(Continued)

(51) Int. Cl.
*C09D 183/08* (2006.01)
*B01J 21/06* (2006.01)
(Continued)

(52) U.S. Cl.
CPC .......... *C09D 183/08* (2013.01); *B01J 21/063* (2013.01); *B01J 31/00* (2013.01); *B01J 33/00* (2013.01);
(Continued)

(58) Field of Classification Search
None
See application file for complete search history.

(56) References Cited

U.S. PATENT DOCUMENTS 6,337,129 B1    1/2002    Watanabe et al.
8,536,068 B2 *  9/2013    Weidman .............. G03F 7/0752
                                                        257/E21.259
(Continued)

FOREIGN PATENT DOCUMENTS

CN        1226918 A      8/1999
CN      101868762 A     10/2010
(Continued)

OTHER PUBLICATIONS

First Office Action for Chinese Patent Application No. 201710076701.7 dated Dec. 4, 2018 and correspondence dated Dec. 13, 2018 from Liu, Shen & Associates summarizing contents, 6 pages.

(Continued)

Primary Examiner — Stefanie J Cohen
(74) Attorney, Agent, or Firm — Harness, Dickey & Pierce, P.L.C.

(57) ABSTRACT

A method of forming a self-cleaning film system includes depositing a photocatalytic material onto a substrate to form a first layer. The method also includes disposing a photoresist onto the first layer and then exposing the photoresist to light so that the photoresist has a developed portion and an undeveloped portion. The method includes removing the undeveloped portion so that the developed portion protrudes from the first layer. After removing, the method includes depositing a perfluorocarbon siloxane polymer onto the first layer to surround and contact the developed portion. After depositing the perfluorocarbon siloxane polymer, the method includes removing the developed portion to thereby form the self-cleaning film system.

15 Claims, 3 Drawing Sheets

Related U.S. Application Data

(60) Provisional application No. 62/294,496, filed on Feb. 12, 2016.

(51) Int. Cl.

| | | |
|---|---|---|
| *B01J 35/00* | (2006.01) | |
| *B01J 37/02* | (2006.01) | |
| *G03F 7/075* | (2006.01) | |
| *G03F 7/40* | (2006.01) | |
| *B05D 5/08* | (2006.01) | |
| *B01J 31/00* | (2006.01) | |
| *B01J 33/00* | (2006.01) | |
| *B01J 35/06* | (2006.01) | |
| *B05D 1/02* | (2006.01) | |
| *B05D 1/28* | (2006.01) | |
| *B01J 37/34* | (2006.01) | |
| *B05D 3/06* | (2006.01) | |
| *B05D 3/10* | (2006.01) | |
| *B05D 1/18* | (2006.01) | |

(52) U.S. Cl.
CPC .............. *B01J 35/004* (2013.01); *B01J 35/06* (2013.01); *B01J 37/0217* (2013.01); *B01J 37/0219* (2013.01); *B01J 37/0228* (2013.01); *B01J 37/0244* (2013.01); *B05D 1/02* (2013.01); *B05D 1/28* (2013.01); *B05D 5/083* (2013.01); *G03F 7/0752* (2013.01); *G03F 7/40* (2013.01); *B01J 37/0238* (2013.01); *B01J 37/347* (2013.01); *B05D 1/185* (2013.01); *B05D 3/06* (2013.01); *B05D 3/107* (2013.01); *B05D 2506/15* (2013.01); *B05D 2518/10* (2013.01)

(56) References Cited

U.S. PATENT DOCUMENTS

| | | | |
|---|---|---|---|
| 9,861,974 B2 | 1/2018 | Dadheech et al. | |
| 10,052,622 B2 | 8/2018 | Dadheech et al. | |
| 2003/0008217 A1* | 1/2003 | Kobayashi | B82Y 30/00 430/5 |
| 2004/0019143 A1* | 1/2004 | Koloski | C09D 5/1612 524/434 |
| 2009/0130608 A1 | 5/2009 | Irving et al. | |
| 2014/0011013 A1 | 1/2014 | Jin et al. | |
| 2015/0224539 A1 | 8/2015 | Lyons et al. | |

FOREIGN PATENT DOCUMENTS

| | | |
|---|---|---|
| CN | 101962514 A | 2/2011 |
| CN | 107083184 A | 8/2017 |
| DE | 102017102760 A1 | 8/2017 |
| WO | WO-0234687 A1 | 5/2002 |

OTHER PUBLICATIONS

Paz, Yaron, "Self-assembled monolayers and titanium dioxide: From surface patterning to potential applications," *Beilstein J. Nanotechnol.* 2011, 2, pp. 845-861 (Published: Dec. 20, 2011); doi:10.3762/bjnano.2.94.

First Office Action for German Patent Application No. 102017102760.2 dated Dec. 10, 2018 and correspondence dated Dec. 19, 2018 from Manitz, Finsterwald Patentwälte PartnbB summarizing contents, 6 pages.

U.S. Appl. No. 15/429,577, filed Feb. 10, 2017.

CN-107083184-A is a publication of a counterpart Chinese Patent Application No. 201710076701.7 to the present application.

DE-102017102760-A1 is a publication of a counterpart German Patent Application No. 102017102760.2 to the present application.

The present application is a divisional of U.S. Appl. No. 15/429,577, which patented as U.S. Pat. No. 10,052,622.

\* cited by examiner

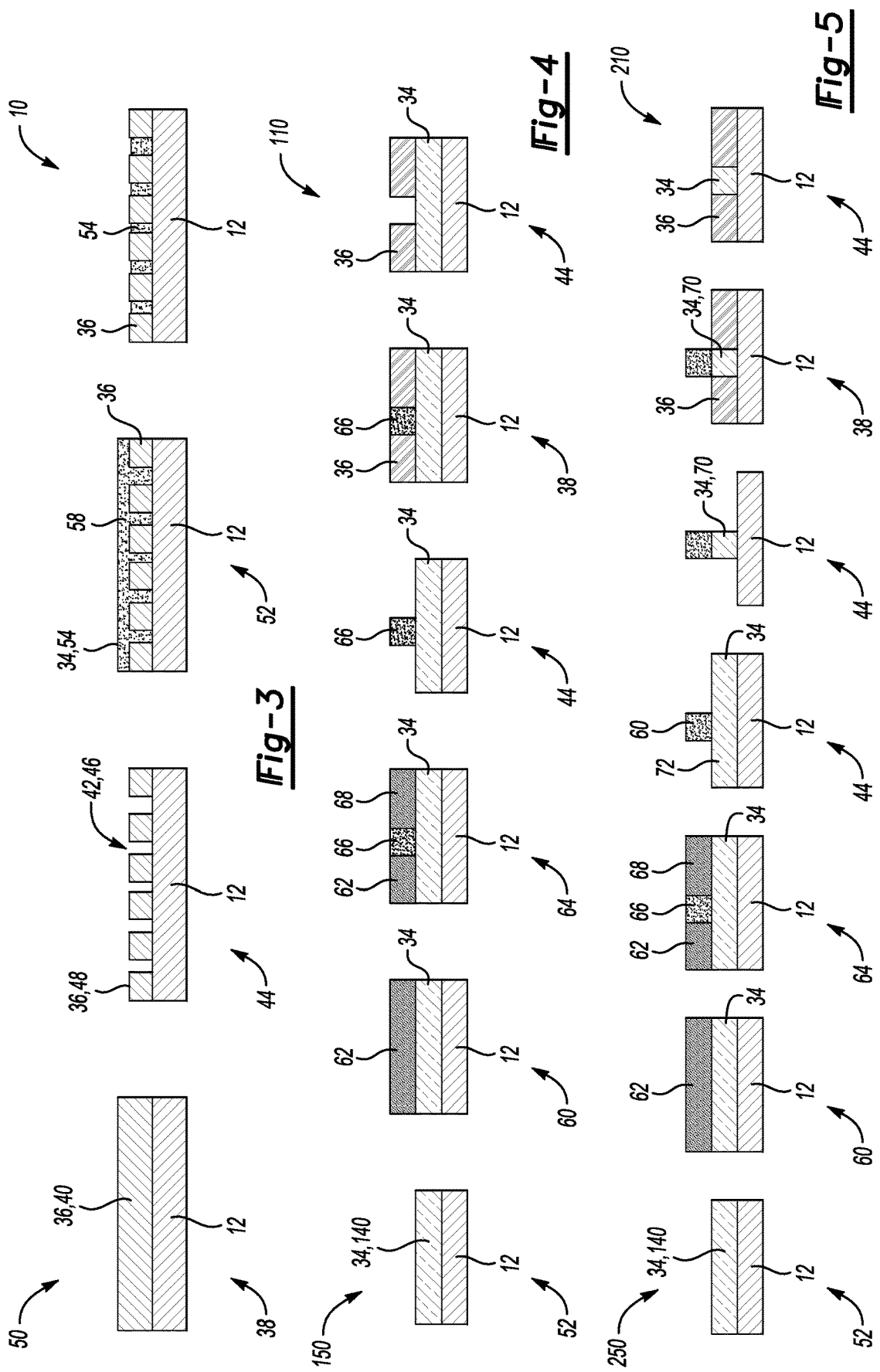

US 10,829,665 B2

METHOD OF FORMING A SELF-CLEANING FILM SYSTEM

CROSS-REFERENCE TO RELATED APPLICATIONS

This application is a divisional of U.S. patent application Ser. No. 15/429,577, now U.S. Pat. No. 10,052,622, filed on Feb. 10, 2017 and published on Aug. 17, 2017 as United States Patent Application Publication No. 2017/0232430, entitled "Method of Forming a Self-Cleaning Film System", the entire disclosure of which is incorporated herein by reference. United States Patent Application Publication No. 2017/0232430 claims priority from U.S. Provisional Patent Application No. 62/294,496, filed on Feb. 12, 2016 and entitled "Method of Forming a Self-Cleaning Film System", the entire disclosure of which is incorporated herein by reference.

INTRODUCTION

The disclosure relates to a self-cleaning film system and to a method of forming the self-cleaning film system.

Devices, such as display systems, are often designed to be touched by an operator. For example, a vehicle may include a display system that presents information to an operator via a touchscreen. Similarly, an automated teller machine or kiosk may include a display system that is activated by touch.

Other devices, such as cameras and eyeglasses, generally include a lens surface which may be inadvertently touched by an operator during use. Further, other devices such as vehicles, windows, mirrors, appliances, cabinetry, furniture, cellular telephones, fingerprint scanners, sensors, copiers, medical instruments, and countertops may also include one or more surfaces which may be touched by an operator. Therefore, during use, an operator may deposit fingerprints and/or oils onto such devices and surfaces.

SUMMARY

A method of forming a self-cleaning film system includes depositing a photocatalytic material onto a substrate to form a first layer, and disposing a photoresist onto the first layer. After disposing the photoresist, the method includes exposing the photoresist to light so that the photoresist has a developed portion and an undeveloped portion. The method also includes removing the undeveloped portion so that the developed portion protrudes from the first layer. After removing, the method includes depositing a perfluorocarbon siloxane polymer onto the first layer to surround and contact the developed portion. After depositing the perfluorocarbon siloxane polymer, the method includes removing the developed portion to thereby form the self-cleaning film system.

In one aspect, removing the undeveloped portion may include covering a protected portion of the first layer. In addition, removing the undeveloped portion may include not covering an unprotected portion of the first layer. In another aspect, the method may further include, after removing the undeveloped portion, removing the unprotected portion. Removing the unprotected portion may include acid etching away the unprotected portion so that the protected portion remains and projects from the substrate.

Depositing may include magnetron sputtering the photocatalytic material onto the substrate. Further, depositing may include forming a self-aligned monolayer that is physically adsorbed and cross-linked through a siloxane moiety. In addition, depositing may include chemically bonding the photocatalytic material to the substrate to surround and abut the protected portion.

Disposing may include transferring a predetermined pattern onto the substrate.

Exposing may include developing the photoresist to transfer a pattern onto the first layer.

Removing the undeveloped portion may include wiping the undeveloped portion with a solvent that is reactive with the photoresist. Further, removing the developed portion may include wiping the developed portion with a solvent that is reactive with the photoresist.

The method may further include contacting the perfluorocarbon siloxane polymer and squalene. In addition, the method may include oxidizing the squalene. Further, the method may include vaporizing the squalene.

A method of forming a self-cleaning film system includes synthesizing a titanium dioxide nanoparticle siloxane, and mixing the titanium dioxide nanoparticle siloxane and a perfluorocarbon siloxane polymer to form a solution. The method also includes applying the solution to a substrate to thereby form the self-cleaning film system.

In one aspect, the perfluorocarbon siloxane polymer has a backbone, and synthesizing includes selecting a thiol to link the titanium dioxide nanoparticle siloxane to the backbone.

The method may further include, after applying, reapplying the solution.

In another aspect, the method may include contacting the self-cleaning film system and squalene. The method may further include oxidizing and vaporizing the squalene.

The above features and advantages and other features and advantages of the present disclosure are readily apparent from the following detailed description of the best modes for carrying out the disclosure when taken in connection with the accompanying drawings.

BRIEF DESCRIPTION OF THE DRAWINGS

FIG. 3 is a schematic illustration of one embodiment of a method of forming the self-cleaning film system of FIGS. 1 and 2.

FIG. 4 is a schematic illustration of a second embodiment of a method of forming the self-cleaning film system of FIGS. 1 and 2.

FIG. 5 is a schematic illustration of a third embodiment of a method of forming the self-cleaning film system of FIGS. 1 and 2.

DETAILED DESCRIPTION

Figure 1:
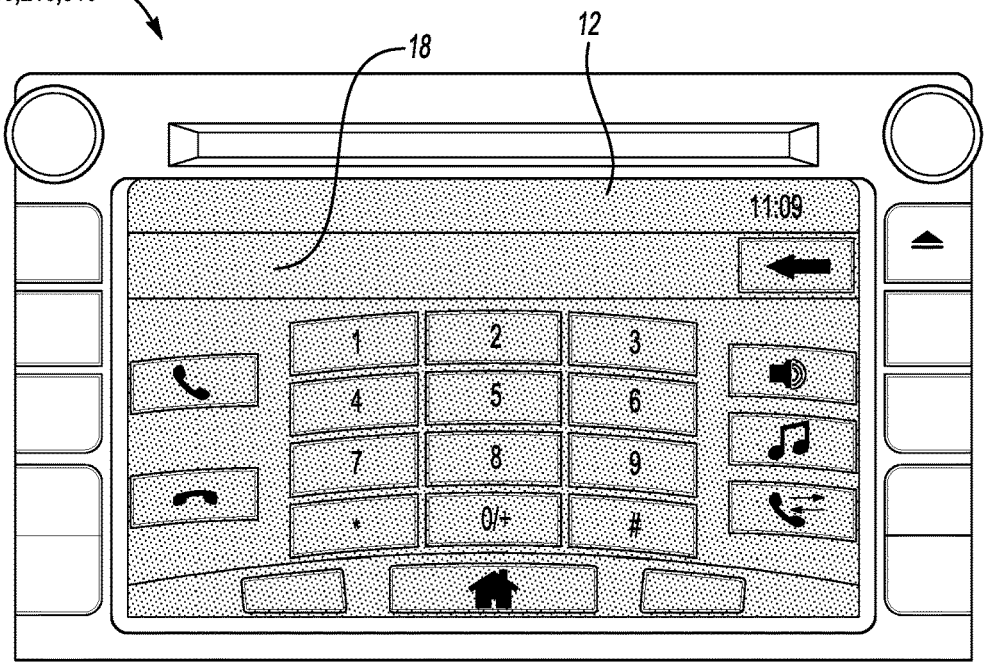
FIG. 1 is a schematic illustration of a front view of a self-cleaning film system.

Referring to the Figures, wherein like reference numerals refer to like elements, a self-cleaning film system 10, 110, 210, 310 is shown generally in FIG. 1. The self-cleaning film system 10, 110, 210, 310 may be suitable for applications in which an operator may touch and deposit fingerprints, oils, and/or other organic or carbon-based contaminants or pathogens onto a screen, lens, or surface. More specifically, the self-cleaning film system 10, 110, 210, 310 may be useful for applications requiring a clean, substantially oil- or fingerprint-free screen, lens, or surface. That is, the self-cleaning film system 10 may be useful for removing fingerprints and other organic contaminants from such screens, lenses, or surfaces.

For example, the self-cleaning film system 10, 110, 210, 310 may be useful for automotive applications such as in-dash navigation systems which include a touchscreen, vehicle cameras which include a lens, vehicle mirrors, and vehicle interior surfaces. Alternatively, the self-cleaning film system 10, 110, 210, 310 may be useful for non-automotive applications such as, but not limited to, consumer electronics, cellular telephones, eyewear, personal protective equipment, appliances, furniture, kiosks, fingerprint scanners, medical devices, sensors, aircraft, and industrial vehicles.

Figure 2:
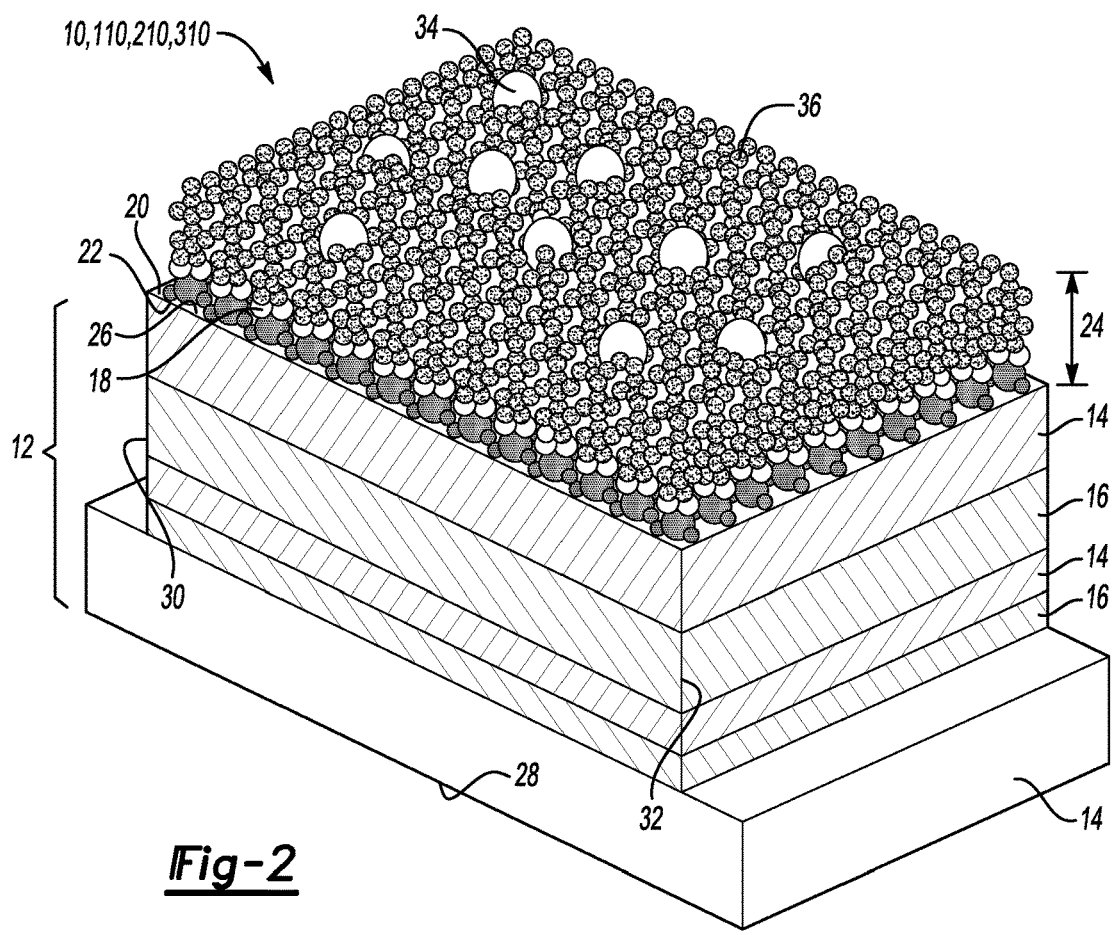
FIG. 2 is a schematic illustration of a magnified, perspective view of the self-cleaning film system of FIG. 1.

Referring now to FIG. 2, the self-cleaning film system 10, 110, 210, 310 may be applied to a substrate 12. The substrate 12 may be formed from a vitreous, transparent material suitable for refracting visible light. For example, in one embodiment, the substrate 12 may be formed from silicon dioxide. In another example, the substrate 12 may be formed from a polycarbonate or other plastic. Alternatively, as best shown in FIG. 2, the substrate 12 may be formed from an anti-reflective coating comprising alternating layers 14, 16 of silicon dioxide and titanium dioxide. That is, the substrate 12 may be an anti-reflective film or coating. In general, the substrate 12 may be configured as, by way of non-limiting examples, a screen of a display system, a lens of eyeglasses or goggles, a visor of a helmet, a surface of a refrigerator, a face of a cabinet, a door panel of a vehicle, a touchscreen of a kiosk, or as any other surface or device that may be touched by an operator.

The self-cleaning film system 10, 110, 210, 310 also includes a film 18 to be disposed on the substrate 12, e.g., chemically bonded to the substrate 12 as set forth in more detail below. The film 10, 110, 210, 310 may be configured to cover and protect the substrate 12 from fingerprints, oils, and organic contaminants. That is, the film 18 may be configured to cause fingerprints, oils, and organic contaminants deposited on the film 18 to vanish, disappear, or vaporize so as to maintain a clean substrate 12 that is capable of displaying crisp images or reflections.

More specifically, as described with reference to FIG. 2, the film 18 may have a first surface 20 and a second surface 22 spaced opposite the first surface 20. The second surface 22 may abut the substrate 12, and the first surface 20 may be substantially free from squalene, organic material, and/or other oils of fatty acids. As used herein, the terminology squalene refers to an organic compound having 30 carbon atoms and represented by the International Union of Pure and Applied Chemistry name (6E,10E,14E,18E)-2,6,10,15, 19,23-hexamethyltetracosa-2,6,10,14,18,22-hexaene. In general, the film 18 may be characterized as a thin film and may have a thickness 24 of, for example, from 10 μm to 150 μm.

The substrate 12 also has a proximal surface 26 abutting the second surface 22 and a distal surface 28 spaced opposite the proximal surface 26. Therefore, the substrate 12 and the film 18 are configured to transmit visible light through the proximal surface 26, the distal surface 28, the first surface 20, and the second surface 22. The substrate 12 also has a first edge 30 connecting the proximal surface 26 and the distal surface 28, and a second edge 32 spaced opposite the first edge 30.

The film 18 may define a contact angle with water of greater than or equal to 115°, e.g., greater than 140°. For example, the film 18 may define a contact angle with water of greater than or equal to 150°. As such, water, oils, and contaminants may effectively bead on and translate across the first surface 20. Stated differently, water, oils, and contaminants may be mobile and effectively translate along the first surface 20.

Although not shown, the self-cleaning film system 10, 110, 210, 310 may further include a light source disposed adjacent the first edge 30 and configured for emitting electromagnetic radiation. For example, the light source may be an ultraviolet light-emitting diode and the electromagnetic radiation may have a wavelength of from 400 nm to 100 nm. Alternatively, the light source may be an incandescent bulb or a visible light-emitting diode and the electromagnetic radiation may have a wavelength of from 740 nm to 380 nm.

Referring again to FIG. 2, the film 18 is formed from a self-cleaning coating composition. That is, the film 18 may mitigate fingerprint and oil deposition, i.e., self-clean. The self-cleaning coating composition includes a photocatalytic material 34 (FIGS. 3-5) and a perfluorocarbon siloxane polymer 36 (FIGS. 3-5), as set forth in more detail below.

The photocatalytic material 34 may provide the film 18 with self-cleaning capability. That is, the photocatalytic material 34 may oxidize and/or vaporize any organic material, e.g., squalene, present on the first surface 20 of the film 18, as set forth in more detail below. In particular, the photocatalytic material 34 may be a light-activated photocatalyst upon exposure to, for example, visible or ultraviolet light.

Suitable photocatalytic materials 34 may include, but are not limited to, photo-oxidative semiconductors, semiconducting oxides, doped metal oxides, heterojunction materials, and combinations thereof.

In one embodiment, the photocatalytic material 34 may be titanium dioxide and may be present in a rutile form. Alternatively, the photocatalytic material 34 may be titanium dioxide and may be present in an anatase form, which may exhibit a comparatively higher photocatalytic activity than the rutile form. In other embodiments, the photocatalytic material 34 may be titanium dioxide and may be present as a combination of the rutile form and the anatase form. Further, the photocatalytic material 34 may be doped to form a functionalized photocatalytic material, e.g., functionalized titanium dioxide. For example, the functionalized photocatalytic material may be doped with a metal such as, but not limited to, silver, chromium, cobalt, copper, vanadium, iron, silver, platinum, molybdenum, lanthanum, niobium, and combinations thereof. Alternatively, the functionalized photocatalytic material may be doped with a non-metal such as, but not limited to, nitrogen, sulfur, carbon, boron, potassium, iodine, fluorine, and combinations thereof.

The photocatalytic material 34 may be characterized as a nanoparticle and may have an average diameter measureable on a nanometer scale. Alternatively, the photocatalytic material 34 may be characterized as a particle and may have an average diameter measureable on a micrometer scale. Generally, the photocatalytic material 34 may be present in the self-cleaning coating composition or film 18 in an amount of from about 2 parts by volume to about 35 parts by volume based on 100 parts by volume of the film 18.

In other non-limiting embodiments, the photocatalytic material 34 may include a semiconducting oxide such as, but not limited to, zinc oxide, bismuth, tin oxide, and combinations thereof. The semiconducting oxide may be selected to have a band gap separation suitable for a photocatalytic reaction, as set forth in more detail below.

Referring now to FIGS. 3-5, the self-cleaning coating composition and film 18 include a perfluorocarbon siloxane polymer 36. As best shown in FIG. 3, the perfluorocarbon siloxane polymer 36 may form a majority of the film 18 and may be characterized as a monolayer field. As used herein, the terminology monolayer refers to a layer having a thickness 24 (FIG. 2) of one molecule. That is, the monolayer may be one molecule thick and may be characterized as a thin layer. In one embodiment, the perfluorocarbon siloxane polymer is a perfluorinated organosiloxane. For example, the perfluorocarbon siloxane polymer may be a polytetrafluoroethylene (PTFE) siloxane polymer.

Referring now to FIG. 3, a method 50 of forming the self-cleaning film system 10 includes depositing 38 the perfluorocarbon siloxane polymer 36 onto the substrate 12 to form a first layer 40. The perfluorocarbon siloxane polymer 36 may be deposited or coated onto the substrate 12 in any suitable manner. By way of non-limiting examples, depositing 38 may include chemical vapor depositing (CVD), physical vapor deposition (PVD), atomic layer deposition (ALD), dipping, wiping, spraying, meniscus coating, wet coating, combinations thereof, and the like. Depositing 38 may include forming a self-aligned monolayer that is physically adsorbed, i.e., physisorbed, and cross-linked with neighboring molecules through a siloxane moiety.

The method 50 also includes removing 44 a plurality of portions 46 of the first layer 40 to define a plurality of cavities 42 in the first layer 40 and form a plurality of projections 48 that protrude from the substrate 12. The plurality of portions 46 may be removed by any suitable manner. By way of non-limiting examples, removing 44 may include ultraviolet photoablating through an optical mask or plasma etching through a fine metal mask. For example, removing 44 may include projecting plasma or ions at the first layer 40 through a mask to thereby etch away the plurality of portions 46, define the plurality of cavities 42, and form the plurality of projections 48.

The method 50 also includes depositing 52 the photocatalytic material 34 onto the plurality of projections 48 and into the plurality of cavities 42 to form a second layer 54. Depositing 38 may include chemically bonding the photocatalytic material 34 to the substrate 12 within the plurality of cavities 42. The photocatalytic material 34 may be deposited onto the plurality of projections 48 in any suitable manner. For example, the photocatalytic material, such as titanium dioxide, may be deposited onto the plurality of projections 48 and into the plurality of cavities 42 via magnetron sputtering. The magnetron sputtering, for example, may be reactive using a titanium metal target or may be direct deposition from a ceramic titanium dioxide target.

Referring again to FIG. 3, the second layer 54 has a bonded portion 56 disposed in the plurality of cavities 42 and in contact with the substrate 12, and a non-bonded portion 58 disposed on the plurality of projections 48 and spaced apart from the substrate 12. That is, nucleation of the photocatalytic material 34 and substrate-bonding and growth may be efficient in high-surface energy areas, i.e., the plurality of cavities 42 or areas without the perfluorocarbon siloxane polymer 36 present, to form the bonded portion 56, and inefficient in low-surface energy areas, i.e., the plurality of projections or non-bonded portions 58 or areas which include the perfluorocarbon siloxane polymer 36 projecting from the substrate 12, to form the non-bonded portion 58.

The method 50 also includes, after depositing 52 the photocatalytic material 34, removing 44 the non-bonded portion 58 to thereby form the self-cleaning film system 10. The non-bonded portion 58 may be removed in any suitable manner. By way of non-limiting examples, removing 44 may include washing or wiping away the non-bonded portion 58.

The method 50 may further include, after removing 44 the non-bonded portion 58, removing the plurality of projections 48. For example, the plurality of projections 48 may be removed during use due to wear of the self-cleaning film system 10. However, after removing 44 the plurality of projections 48, the method 50 may include redepositing the perfluorocarbon siloxane polymer 36. The perfluorocarbon siloxane polymer 36 may be redeposited in any suitable manner. By way of non-limiting examples, redepositing may include wiping the perfluorocarbon siloxane polymer 36 onto the substrate 12 so that the perfluorocarbon siloxane polymer 36 contacts the bonded portion 56.

The method 50 may further include contacting the bonded portion 56 and squalene. That is, contacting may include touching the bonded portion 56 such that an operator deposits fingerprints, squalene, organic matter, and/or oils onto the first surface 20 (FIG. 2). Oils may include oils of fatty acids and may be synthesized naturally and applied to the bonded portion 56 as the operator touches the bonded portion 56, or may be applied to the bonded portion 56 artificially such as by spraying or coating.

Contact between the squalene, the photocatalytic material 34 which is exposed to electromagnetic radiation emitted by a light source having a wavelength of less than 357 nm, and water may initiate formation of radicals. The radicals may then react with hydrocarbon debris. More specifically, the photocatalytic material may be a photocatalyst such as titanium dioxide. A photocatalytic reaction may create a strong oxidation agent and breakdown the organic matter, e.g., squalene, to low chain hydrocarbon to carbon dioxide and water in the presence of the photocatalyst, i.e., the photocatalytic material 34; electromagnetic radiation, e.g., ultraviolet light; and water, e.g., humidity from ambient conditions. As such, the photocatalytic material 34 may not be consumed by the catalytic reaction, but may instead only accelerate the photocatalytic reaction as a non-reactant.

In greater detail, when electromagnetic radiation having a desired wavelength illuminates the photocatalytic material 34, an electron from the valence band of the photocatalytic material 34 may promote to the conduction band of the photocatalytic material 34, which in turn may create a hole in the valence band and an excess of negative charge or electron in the conduction band. The hole may assist oxidation and the electron may assist reduction. Generally, the hole may combine with water to produce a hydroxyl radical (•OH). The hole may also react directly with squalene or other organic material to increase an overall self-cleaning efficiency of the self-cleaning film system 10. Similarly, oxygen in the ambient environment surrounding the photocatalytic material 34 may be reduced by the electron to form a superoxide ion (•O2—), which in turn may oxidize the organic material present on the self-cleaning film system 10. Therefore, the method 50 may include oxidizing the squalene as well as other hydrocarbons.

In addition, the hole may become trapped before recombination with the electron. For such situations, the photocatalytic material 34 may be functionalized. For example, the method may include doping titanium dioxide with, for example, palladium or ruthenium. The palladium or ruthenium may act as an electrocatalyst and may increase a transfer of electrons to oxygen molecules, which may in turn lower the occurrence of the recombination of electrons and holes.

Further, organic material that is present on the perfluorocarbon siloxane polymer 36 rather than in direct contact with the photocatalytic material 34 may be in dynamic equilibrium with the first surface 20 (FIG. 2) and may diffuse toward a comparatively higher-energy location on the film 18, i.e., the photocatalytic material 34. Therefore, the method 50 may also include diffusing the squalene along the film 18 from the perfluorocarbon siloxane polymer 36 to the photocatalytic material 34. To improve such diffusion, the light source may be tuned to emit electromagnetic radiation having a wavelength that is tuned to a vibration resonance of the squalene and the perfluorocarbon siloxane polymer 36. Such tuning may enable the squalene or fingerprint to wiggle or translate along the perfluorocarbon siloxane polymer 36 to the photocatalytic material 34 where the squalene may undergo the photocatalytic reaction described above. Alternatively or additionally, the film 18 may also be heated, for example by infrared radiation, to further improve diffusion across the perfluorocarbon siloxane polymer 36 towards the photocatalytic material 34.

As such, the method 50 may further include vaporizing the squalene. More specifically, once the squalene contacts the photocatalytic material 34, the squalene may be photolyzed into comparatively low vapor pressure-sized pieces or parts, which may vaporize off the film 18 and thereby remove the fingerprint or squalene from the film 18. Therefore, the self-cleaning film system 10 may be characterized as self-cleaning. That is, the film 18 may protect the substrate 12 by removing, e.g., oxidizing and vaporizing the fingerprints, squalene, oils, and/or organic material deposited by the touch of an operator. Consequently, the self-cleaning film system 10 and method 50 may provide excellent aesthetics, cleanliness, and readability for display systems, lenses, sensors, and surfaces.

Advantageously, the method 50 produces minimal waste and includes few processes. Further, although the bonded portion 56 of the photocatalytic material 34 may be substantially permanently attached the substrate 12, the perfluorocarbon siloxane polymer 36 may be reapplied after wear.

Referring now to FIG. 4, in a second embodiment, the method 150 of forming a self-cleaning film system 110 includes depositing 52 the photocatalytic material 34 onto the substrate 12 to form the first layer 140. The photocatalytic material 34 may be deposited onto the substrate 12 in any suitable manner. By way of non-limiting examples, depositing 52 may include atomic layer depositing (ALD), magnetron sputtering, electron beam evaporation, chemical vapor depositing (CVD), and the like. The magnetron sputtering, for example, may be reactive using a titanium metal target or may be direct deposition from a ceramic titanium dioxide target.

The method 150 further includes disposing 60 a photoresist 62 onto the first layer 140. The terminology photoresist 62 refers to a photosensitive resist that, when exposed to light, loses a resistance or susceptibility to attack by an etchant or solvent. Therefore, the photoresist 62 may be useful for forming a pattern on the first layer 140. The photoresist 62 may be characterized as positive or negative. For example, the method 150 may include disposing 60 a positive photoresist 62 onto the substrate 12 to transfer a predetermined pattern onto the substrate 12.

After disposing 60 the photoresist 62, the method 150 also includes exposing 64 the photoresist 62 to light, e.g., visible light or ultraviolet light via an optical mask or photomask, so that the photoresist 62 has a developed portion 66 and an undeveloped portion 68. That is, exposing 64 may include a photolithographic process and may develop the photoresist 62 to transfer a desired pattern onto the first layer 140. For example, exposing 64 may include forming the developed portion 66 and the undeveloped portion 68 according to a desired pattern, size, and density of the photocatalytic material 34 for the finished self-cleaning film system 20.

As described with continued reference to FIG. 4, the method 150 also includes removing 44 the undeveloped portion 68 so that the developed portion 66 protrudes from the first layer 140. The undeveloped portion 68 may be removed in any suitable manner. By way of non-limiting examples, removing 44 may include wiping the undeveloped portion 68 with a solvent that is reactive with the photoresist 62.

After removing 44, the method 150 includes depositing 38 the perfluorocarbon siloxane polymer 36 onto the first layer 140 to surround and contact the developed portion 66. The perfluorocarbon siloxane polymer 36 may be deposited or coated onto the first layer 140 in any suitable manner. By way of non-limiting examples, depositing 38 may include chemical vapor depositing (CVD), atomic layer deposition (ALD), dipping, wiping, spraying, meniscus coating, wet coating, combinations thereof, and the like. Depositing 38 may include forming a self-aligned monolayer that is physically adsorbed, i.e., physisorbed, and cross-linked with neighboring molecules through a siloxane moiety.

After depositing 38 the perfluorocarbon siloxane polymer 36, the method 150 includes removing 44 the developed portion 66 to thereby form the self-cleaning film system 20. The developed portion 66 may be removed in any suitable manner. By way of non-limiting examples, removing 44 may include wiping or washing the developed portion 66. For example, removing 44 may include wiping the developed portion 66 with a suitable solvent that is reactive with the photoresist 62. For the method 150, the self-cleaning film system 20 may have a comparatively high reflectivity.

Referring to FIG. 5, in a third embodiment, a method 250 of forming the self-cleaning film system 210 includes depositing 52 the photocatalytic material 34 onto the substrate 12 to form the first layer 140, as set forth above. The method 250 further includes disposing 60 the photoresist 62 onto the first layer 140, as also set forth above. After disposing 60 the photoresist 62, the method 250 also includes exposing 64 the photoresist 62 to light, e.g., visible light or ultraviolet light via an optical mask or photomask, so that the photoresist 62 has a developed portion 66 and an undeveloped portion 68, as further set forth above.

The method 250 also includes removing 44 the undeveloped portion 68 so that the developed portion 66 protrudes from the first layer 140. Removing the undeveloped portion 68 may include covering a protected portion 70 of the first layer 140. Further, removing the undeveloped portion 68 may include not covering an unprotected portion 72 of the first layer 140. The undeveloped portion 68 may be removed in any suitable manner. By way of non-limiting examples, removing 44 may include wiping the undeveloped portion 68 with a solvent that is reactive with the photoresist 62.

After removing 44 the undeveloped portion 68, the method 250 may include removing 44 the unprotected portion 72. For example, removing 44 may include acid etching away the unprotected portion 72 of the photocatalytic material 34 so that the protected portion 70 remains and projects from the substrate 12.

After removing 44 the unprotected portion 72, the method 250 includes depositing 38 the perfluorocarbon siloxane polymer 36 onto the substrate 12 to surround and contact the protected portion 70. The perfluorocarbon siloxane polymer 36 may be deposited or coated onto the substrate 12 in any suitable manner. By way of non-limiting examples, depositing 38 may include chemical vapor depositing (CVD), atomic layer deposition (ALD), physical vapor deposition (PVD), dipping, wiping, spraying, meniscus coating, wet coating, combinations thereof, and the like. Depositing 38 may include forming a self-aligned monolayer that is physically adsorbed, i.e., physisorbed, and cross-linked with neighboring molecules through a siloxane moiety. That is, depositing 38 may include chemically bonding the photocatalytic material 34 to the substrate 12 to surround and abut the protected portion 70.

After depositing 38 the perfluorocarbon siloxane polymer 36, the method 250 includes removing 44 the developed portion 66 to thereby form the self-cleaning film system 210. The developed portion 66 may be removed in any suitable manner. By way of non-limiting examples, removing 44 may include wiping or washing the developed portion 66. For example, removing 44 may include wiping the developed portion 66 with a suitable solvent that is reactive with the photoresist 62. For the method 250, the self-cleaning film system 210 may have a comparatively lower reflectivity because the photocatalytic material 34 may not spoil a reflectance of the self-cleaning film system 210.

Figure 6:
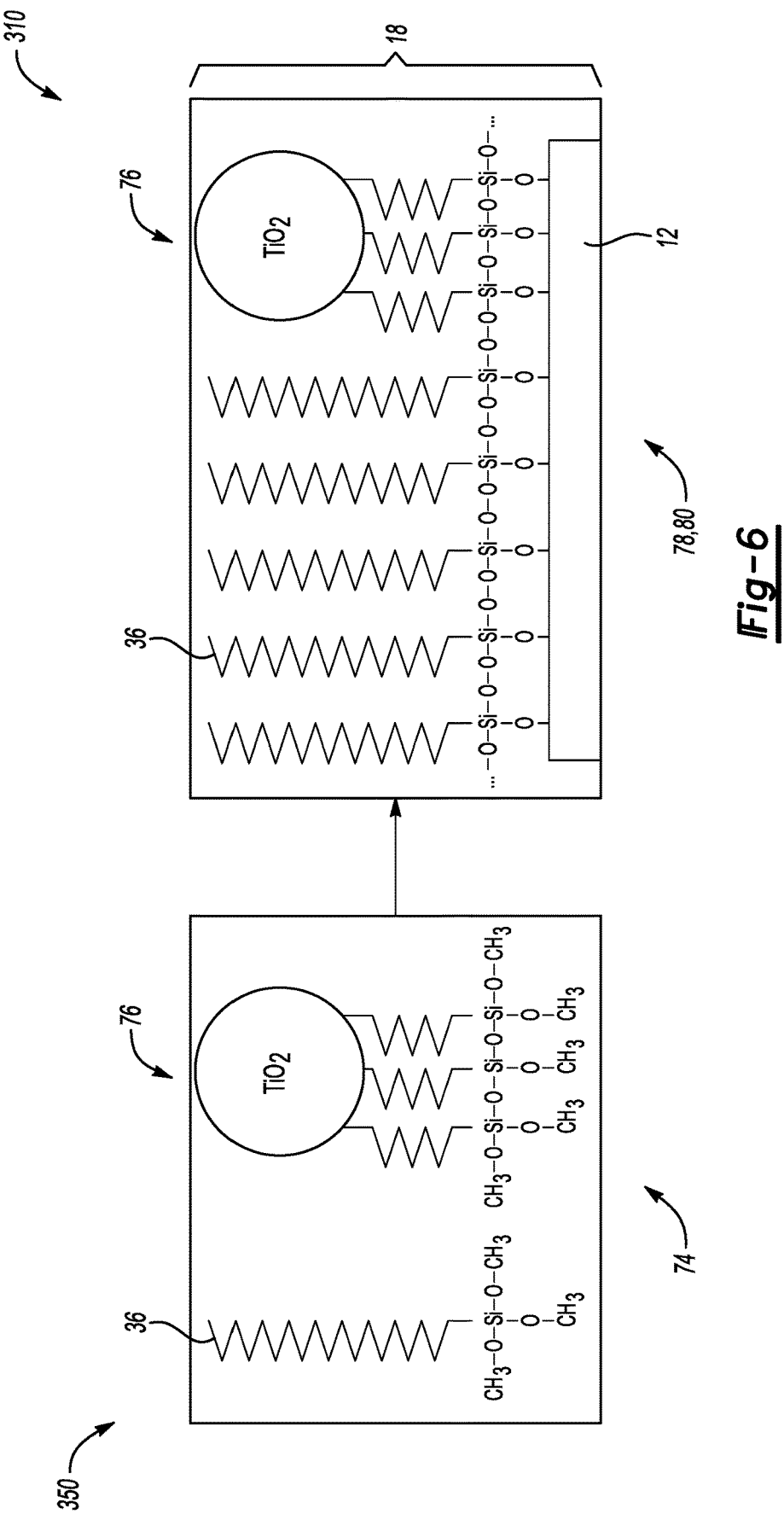
FIG. 6 is a schematic illustration of a fourth embodiment of a method of forming the self-cleaning film system of FIGS. 1 and 2.

Referring now to FIG. 6, in a fourth embodiment, the method 350 of forming the self-cleaning film system 310 may include synthesizing 74 a titanium dioxide nanoparticle siloxane 76, and mixing 78 the titanium dioxide nanoparticle siloxane 76 and the perfluorocarbon siloxane polymer 36 to form a solution. Synthesizing 74 may include selecting a moiety to link the titanium dioxide to a backbone of the perfluorocarbon siloxane polymer 36. For example, the moiety may be a thiol. Further, mixing 78 may include selecting a ratio or proportion of the titanium dioxide nanoparticle siloxane 76 and the perfluorocarbon siloxane polymer 36.

The method 350 may further include applying 80 the solution to the substrate 12 to thereby form the self-cleaning film system 310. The solution may be applied to the substrate via any suitable process. By way of non-limiting examples, applying 80 may include codepositing, chemical vapor depositing (CVD), plasma CVD, atomic layer deposition (ALD), dipping, wiping, spraying, meniscus coating, sol-gel, wet coating, combinations thereof, and the like. Applying 80 may include roughening the photocatalytic material 34 to provide chunks or nodules of the photocatalytic material 34. Such roughening may form a film 18 having a raspberry-like or rough microstructure, which may contribute to an oleophobicity of the film 18 and self-cleaning film system 40.

In addition, the method 350 may also include, after applying 80, reapplying the perfluorocarbon siloxane polymer 36 to the substrate 12. For example, some of the originally-applied perfluorocarbon siloxane polymer 36 may be removed during use due to wear of the self-cleaning film system 310. However, the method 350 may include reapplying the perfluorocarbon siloxane polymer 36. The perfluorocarbon siloxane polymer 36 may be reapplied in any suitable manner. By way of non-limiting examples, reapplying may include wiping the perfluorocarbon siloxane polymer 36 onto the substrate 12. As such, the method 350 is simple and cost-effective.

While the best modes for carrying out the disclosure have been described in detail, those familiar with the art to which this disclosure relates will recognize various alternative designs and embodiments for practicing the disclosure within the scope of the appended claims.

What is claimed is:

1. A method of forming a self-cleaning film system, the method comprising:
    depositing a photocatalytic material onto a substrate to form a first layer;
    disposing a photoresist onto the first layer;
    after disposing the photoresist, exposing the photoresist to light so that the photoresist has a developed portion and an undeveloped portion;
    removing the undeveloped portion so that the developed portion protrudes from the first layer;
    after removing, depositing a perfluorocarbon siloxane polymer onto the first layer to surround and contact the developed portion; and
    after depositing the perfluorocarbon siloxane polymer, removing the developed portion to thereby form the self-cleaning film system.

2. The method of claim 1, wherein removing the undeveloped portion includes covering a protected portion of the first layer.

3. The method of claim 2, wherein removing the undeveloped portion includes not covering an unprotected portion of the first layer.

4. The method of claim 3, further including, after removing the undeveloped portion, removing the unprotected portion.

5. The method of claim 4, wherein removing the unprotected portion includes acid etching away the unprotected portion so that the protected portion remains and projects from the substrate.

6. The method of claim 1, wherein depositing includes magnetron sputtering the photocatalytic material onto the substrate.

7. The method of claim 1, wherein disposing includes transferring a predetermined pattern onto the substrate.

8. The method of claim 1, wherein exposing includes developing the photoresist to transfer a pattern onto the first layer.

9. The method of claim 1, wherein removing the undeveloped portion includes wiping the undeveloped portion with a solvent that is reactive with the photoresist.

10. The method of claim 1, wherein depositing includes formed a self-aligned monolayer that is physically adsorbed and cross-linked through a siloxane moiety.

11. The method of claim 1, wherein depositing includes chemically bonding the photocatalytic material to the substrate to surround and abut the protected portion.

12. The method of claim 1, wherein removing the developed portion includes wiping the developed portion with a solvent that is reactive with the photoresist.

13. The method of claim 1, further including contacting the perfluorocarbon siloxane polymer and squalene.

14. The method of claim 13, further including oxidizing the squalene.

15. The method of claim 13, further including vaporizing the squalene.

* * * * *